(12) United States Patent
Schaedler et al.

(10) Patent No.: US 12,230,659 B1
(45) Date of Patent: Feb. 18, 2025

(54) INTERPOSER FOR CURVED DETECTOR

(71) Applicant: HRL Laboratories, LLC, Malibu, CA (US)

(72) Inventors: Tobias A. Schaedler, Oak Park, CA (US); Florian G. Herrault, Malibu, CA (US); Kevin Geary, Malibu, CA (US); Mark O'Masta, Oak Park, CA (US); Kayleigh A. Porter, Malibu, CA (US); Minh B. Nguyen, Malibu, CA (US)

(73) Assignee: HRL LABORATORIES, LLP, Malibu, CA (US)

( * ) Notice: Subject to any disclaimer, the term of this patent is extended or adjusted under 35 U.S.C. 154(b) by 857 days.

(21) Appl. No.: 17/325,107

(22) Filed: May 19, 2021

Related U.S. Application Data

(60) Provisional application No. 63/047,641, filed on Jul. 2, 2020.

(51) Int. Cl.
  *H01L 27/146* (2006.01)

(52) U.S. Cl.
  CPC .. *H01L 27/14636* (2013.01); *H01L 27/14634* (2013.01); *H01L 27/14605* (2013.01)

(58) Field of Classification Search
  CPC ............ H01L 27/14601; H01L 27/146; H01L 27/14649; H01L 27/14643; H01L 27/14636; H01L 27/14605; H01L 23/538
  See application file for complete search history.

(56) References Cited

U.S. PATENT DOCUMENTS

| | | | |
|---|---|---|---|
| 9,870,927 B2 | 1/2018 | Keefe et al. | |
| 10,062,727 B2 | 8/2018 | McKnight et al. | |
| 10,221,284 B2 | 3/2019 | Eckel | |
| 10,304,900 B2 | 5/2019 | Keefe et al. | |
| 10,600,739 B1 | 3/2020 | Herrault et al. | |
| 10,748,957 B1 | 8/2020 | Mcknight et al. | |
| 2013/0273752 A1* | 10/2013 | Rudisill | H01R 13/6205 439/39 |
| 2017/0162613 A1* | 6/2017 | Karni | H01L 24/81 |
| 2018/0076257 A1* | 3/2018 | McKnight | H01L 21/304 |
| 2019/0339402 A1* | 11/2019 | Crestani | G01T 1/243 |
| 2019/0386044 A1* | 12/2019 | Lee | H01L 21/6836 |

(Continued)

OTHER PUBLICATIONS

Guenter, B. et al., "Highly curved image sensors: a practical approach for improved optical performance", Optics Express, May 30, 2017, pp. 13010-13023, vol. 25, No. 12, Optical Society of America.

(Continued)

*Primary Examiner* — Eric K Ashbahian
*Assistant Examiner* — Halee Cramer
(74) *Attorney, Agent, or Firm* — Womble Bond Dickinson (US) LLP

(57) ABSTRACT

An interposer for a curved detector. In some embodiments a system includes a curved array photodetector; a first readout integrated circuit, the first readout integrated circuit being substantially flat; and an interposer, between the photodetector and the first readout integrated circuit. The photodetector and the first readout integrated circuit may each have a plurality of electrical contacts. The interposer may include a first conductor connecting a first contact, of the plurality of electrical contacts of the photodetector, and a second contact, of the plurality of electrical contacts of the first readout integrated circuit.

9 Claims, 15 Drawing Sheets

(56) References Cited

U.S. PATENT DOCUMENTS

| | | | |
|---|---|---|---|
| 2020/0169677 A1* | 5/2020 | Johnson | H04N 25/585 |
| 2020/0318255 A1* | 10/2020 | Lhuillier | C30B 29/46 |
| 2021/0306611 A1* | 9/2021 | Brinkley | H04N 23/50 |
| 2021/0376179 A1* | 12/2021 | Bartolome | H01L 31/09 |
| 2023/0154747 A1* | 5/2023 | Oezyilmaz | H01L 21/02499 |
| | | | 257/76 |

OTHER PUBLICATIONS

Unpublished U.S. Appl. No. 16/388,044, filed Apr. 18, 2019.
Unpublished U.S. Appl. No. 16/389,238, filed Apr. 19, 2019.

* cited by examiner

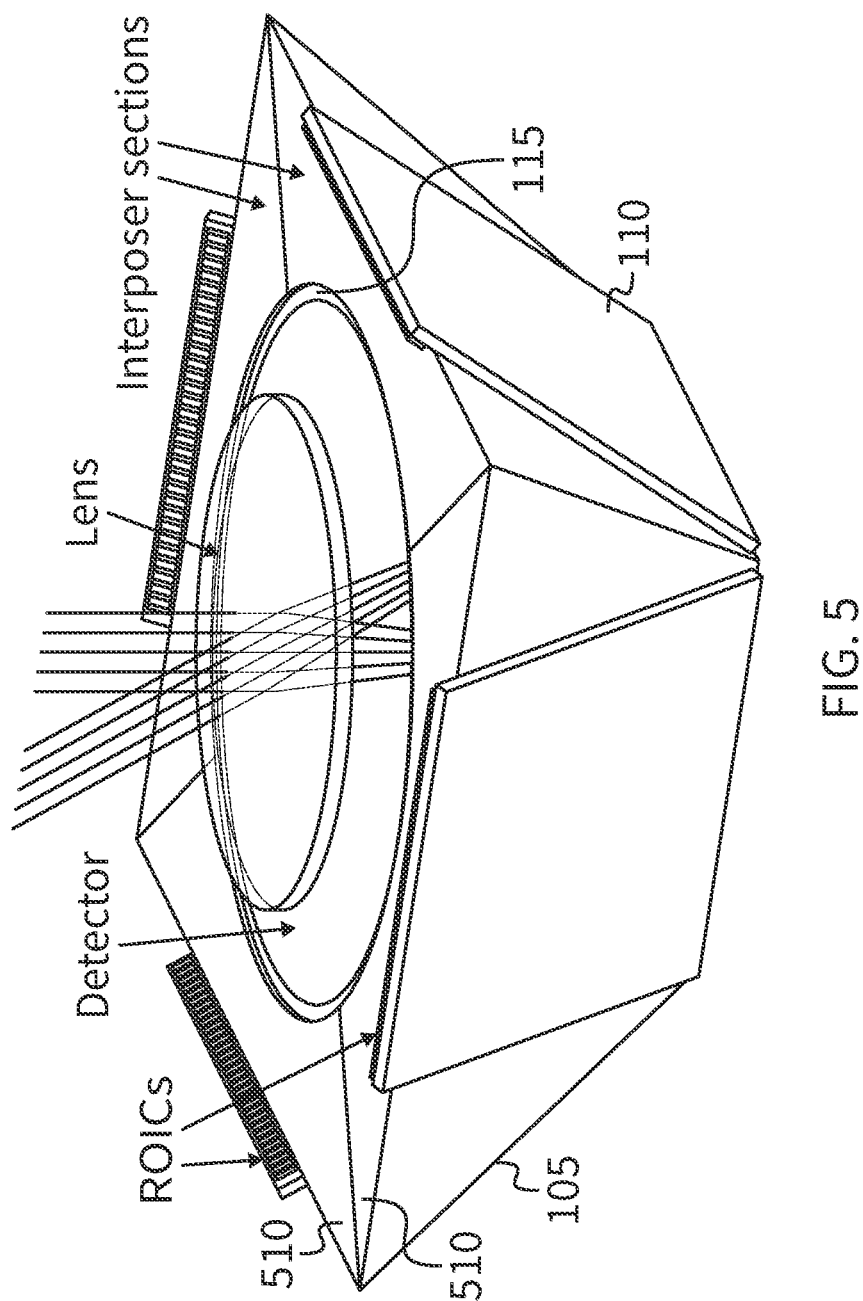

INTERPOSER FOR CURVED DETECTOR

CROSS-REFERENCE TO RELATED APPLICATION(S)

The present application claims priority to and the benefit of U.S. Provisional Application No. 63/047,641, filed Jul. 2, 2020, entitled "CURVED DETECTORS ENABLED BY INTERPOSERS", the entire content of which is incorporated herein by reference.

The present application is related to U.S. patent application Ser. No. 16/388,044, filed Apr. 18, 2019, entitled "HYBRID FOCAL-PLANE ARRAY AND METHOD OF MANUFACTURING THE SAME", and to U.S. Pat. No. 10,748,957, issued Aug. 18, 2020, entitled "METHOD OF MANUFACTURING A CURVED SEMICONDUCTOR DIE", and to U.S. patent application Ser. No. 16/389,238, filed Apr. 19, 2019, entitled "CURVED SEMICONDUCTOR AND METHOD OF FORMING THE SAME", and to U.S. Pat. No. 10,600,739, issued Mar. 24, 2020, entitled "INTERPOSER WITH INTERCONNECTS AND METHODS OF MANUFACTURING THE SAME". Each of the documents identified in this paragraph is incorporated herein by reference.

FIELD

One or more aspects of embodiments according to the present disclosure relate to detectors, and more particularly to an interposer for a curved detector.

BACKGROUND

Wide field of view detectors have various applications, for example as vehicle-mounted sensors providing situational awareness, or as surveillance detectors. It may be challenging to obtain high quality images over a large field of view using a flat detector, however, because the edges and corners of the detector may be more distant from the center of the lens than the center of the detector, so that if the center of the detector is in focus, the edges may be out of focus.

Thus, there is a need for an improved wide field of view detector system.

SUMMARY

According to an embodiment of the present invention, there is provided a system, including: a curved array photodetector; a first readout integrated circuit, the first readout integrated circuit being substantially flat; and an interposer, between the photodetector and the first readout integrated circuit, the photodetector having a plurality of electrical contacts, the first readout integrated circuit having a plurality of electrical contacts, and the interposer including a first conductor connecting a first contact, of the plurality of electrical contacts of the photodetector, and a second contact, of the plurality of electrical contacts of the first readout integrated circuit.

In some embodiments, the system further includes a second conductor, the second conductor connecting a third contact, of the plurality of electrical contacts of the photodetector, and a fourth contact, of the plurality of electrical contacts of the first readout integrated circuit, the third contact being adjacent to the first contact, and the fourth contact being adjacent to the second contact, wherein a separation between the second contact and the fourth contact is different, by at least 10%, from a separation between the first contact and the third contact.

In some embodiments, the separation between the first contact and the third contact is at least 1 micron and at most 100 microns.

In some embodiments: the interposer has a first surface, the first surface being substantially spherical with a first radius of curvature, and the photodetector is substantially spherical, conforms to the first surface, and subtends an angle of at least 10 degrees.

In some embodiments, the photodetector has a plurality of strain relief cuts.

In some embodiments, a maximum chord length of the photodetector is greater than 5 mm and less than 50 mm.

In some embodiments, the photodetector includes at least 500,000 pixels.

In some embodiments, the photodetector includes an infrared photodetector based on a III-V semiconductor structure.

In some embodiments, the system further includes a second readout integrated circuit having a plurality of electrical contacts, wherein the interposer further includes a second conductor connecting a third contact, of the plurality of electrical contacts of the photodetector, and a fourth contact, of the plurality of electrical contacts of the second readout integrated circuit.

According to an embodiment of the present invention, there is provided an interposer, having: a first surface and a second surface, the first surface being substantially flat, and the second surface being curved, the interposer including: an electrically insulating matrix, and a plurality of electrically conductive interconnects, each extending from the first surface to the second surface.

In some embodiments, a first interconnect of the plurality of electrically conductive interconnects is straight.

In some embodiments, a straight line from a first end of the first interconnect to a second end of the first interconnect is oblique to the first surface.

In some embodiments, a first interconnect of the plurality of electrically conductive interconnects is curved, with a first radius of curvature at a point along the length of the first interconnect, the first radius of curvature being less than 3 times the length of the first interconnect, and with a minimum radius of curvature along the length of the first interconnect greater than 0.1 times the length of the first interconnect.

In some embodiments, the electrically insulating matrix, includes, as a major component, a material selected from the group consisting of polymers, ceramic particle filled polymers, polymer-derived ceramics, and sintered ceramics.

In some embodiments, the electrically insulating matrix, includes, as a major component, a material selected from the group consisting of SiOC, SiCN, SiC, SiO2, Al2O3, Al6Si2O13, and combinations thereof.

In some embodiments, a first interconnect of the plurality of electrically conductive interconnects includes, as a major component, a material selected from the group consisting of Cu, Ag, Au, Pt, In, Sn, Bi, and alloys thereof.

In some embodiments, the first interconnect further includes 0.5 wt %-3 wt % of a material selected from the group consisting of Ti, Al, Mg, Zr and mixtures thereof.

In some embodiments, the interposer has, at a point between the first surface and the second surface, a coefficient of thermal expansion greater than 2.6 ppm/K and less than 5.0 ppm/K.

In some embodiments, the interposer has, at a point at the first surface, a coefficient of thermal expansion within 20% of 2.6 ppm/K and, at a point at the second surface, a coefficient of thermal expansion within 20% of 5.0 ppm/K.

In some embodiments, the electrically insulating matrix is fabricated by 3D printing.

BRIEF DESCRIPTION OF THE DRAWINGS

These and other features and advantages of the present disclosure will be appreciated and understood with reference to the specification, claims, and appended drawings wherein:

FIG. 5 is a perspective view of a detector system including a curved detector, according to an embodiment of the present disclosure.

DETAILED DESCRIPTION

The detailed description set forth below in connection with the appended drawings is intended as a description of exemplary embodiments of an interposer for a curved detector provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
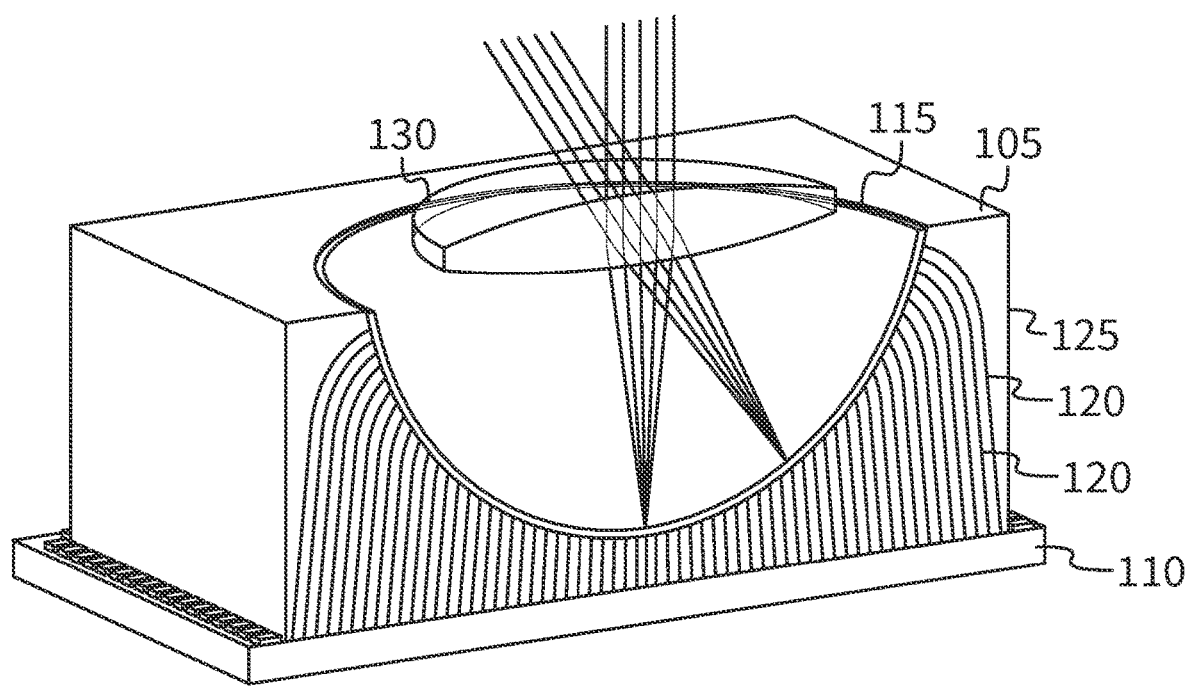
FIG. 1A is a cutaway perspective view of a detector system including a curved detector, according to an embodiment of the present disclosure.

Referring to FIG. 1A, some embodiments include a large-format, cryogenically cooled infrared (IR) detector with a radius of curvature (ROC) of about 12.5 mm. Such a configuration may enable a scalable low-cost method to create a variety of sensor curvatures and optical systems without the risk and expense of designing new readout integrated circuits (ROICs) for each application. FIG. 1A shows such a configuration, with an interposer 105 that has a curved (upper) surface 106 (FIG. 1C) and a flat lower surface 107 (FIG. 1C), a readout integrated circuit 110 at the lower surface 107 of the interposer 105, and a detector 115 (which may be an array photodetector, including a plurality of (uniformly or nonuniformly spaced) pixels, each of which includes an individual photodetector) at the upper (curved) surface 106 of the interposer 105.

The detector may be substantially spherical. As used herein, an array detector that is "substantially spherical" is one for which, for a suitably selected center point, the distance to the center point of each pixel is (i) within 2 mm of the average distance to the center point (the average being taken over all of the pixels), and (ii) within 10% of the average distance to the center point. The readout integrated circuit 110 may be substantially flat, e.g., each point on its upper (active) surface may be within 1 mm of a suitably defined reference plane. The interposer 105 may include a plurality of conductive interconnects 120 in an insulating matrix 125, each interconnect 120 being a conductor connecting a pixel of the detector 115 (e.g., a contact of the pixel) to an input pad of the readout integrated circuit 110 (e.g., to a contact of the readout integrated circuit 110). The separation between any adjacent pixels (e.g., the pitch of the pixels if they are uniformly spaced) (which may be between 1 micron and 100 microns) may be different (e.g., different by 10% or more) from the separation between any input pads (e.g., different from the pitch of the input pads if they are uniformly spaced). FIG. 1C (discussed in further detail below) shows, for example, an interposer 105 including a plurality of conductors, of which the left-most two are separated (i) at the upper (curved) surface 106 of the interposer 105 by a separation x, and, (ii) at the lower (flat) surface 107 of the interposer 105 by a separation y, differing by at least 10% from x.

The readout integrated circuit 110 may, in operation, detect relatively small signals produced by the pixels of the detector 115, and it may generate digital output signals representing, e.g., the irradiance (or "intensity") of the light incident on the pixel, or representing, e.g., the time at which a pulse of light was received or at which a single photon was detected. Each of the input pads of the readout integrated circuit 110 may be connected to a respective amplifier circuit of the readout integrated circuit 110; each such amplifier circuit may in turn be connected to other circuits of the readout integrated circuit 110 (e.g., timing circuits, or analog to digital converters). A lens 130 may focus received light on the detector 115.

Figure 1B:
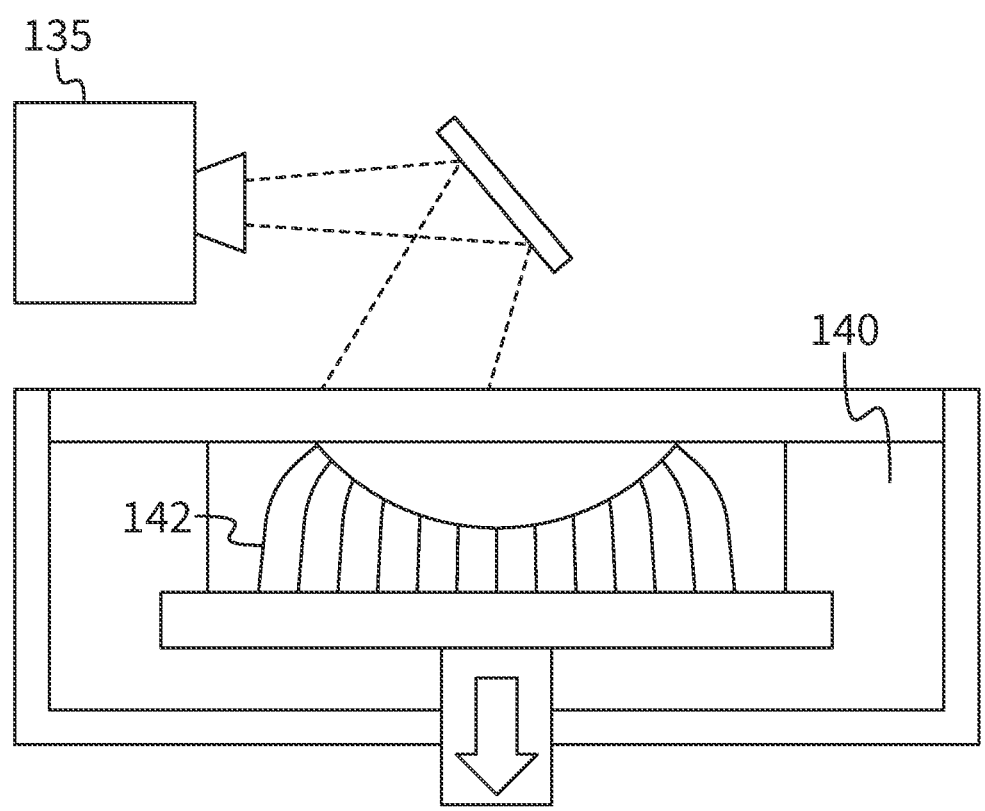
FIG. 1B is schematic side view of a system for fabricating an interposer matrix, according to an embodiment of the present disclosure.
Figure 1C:
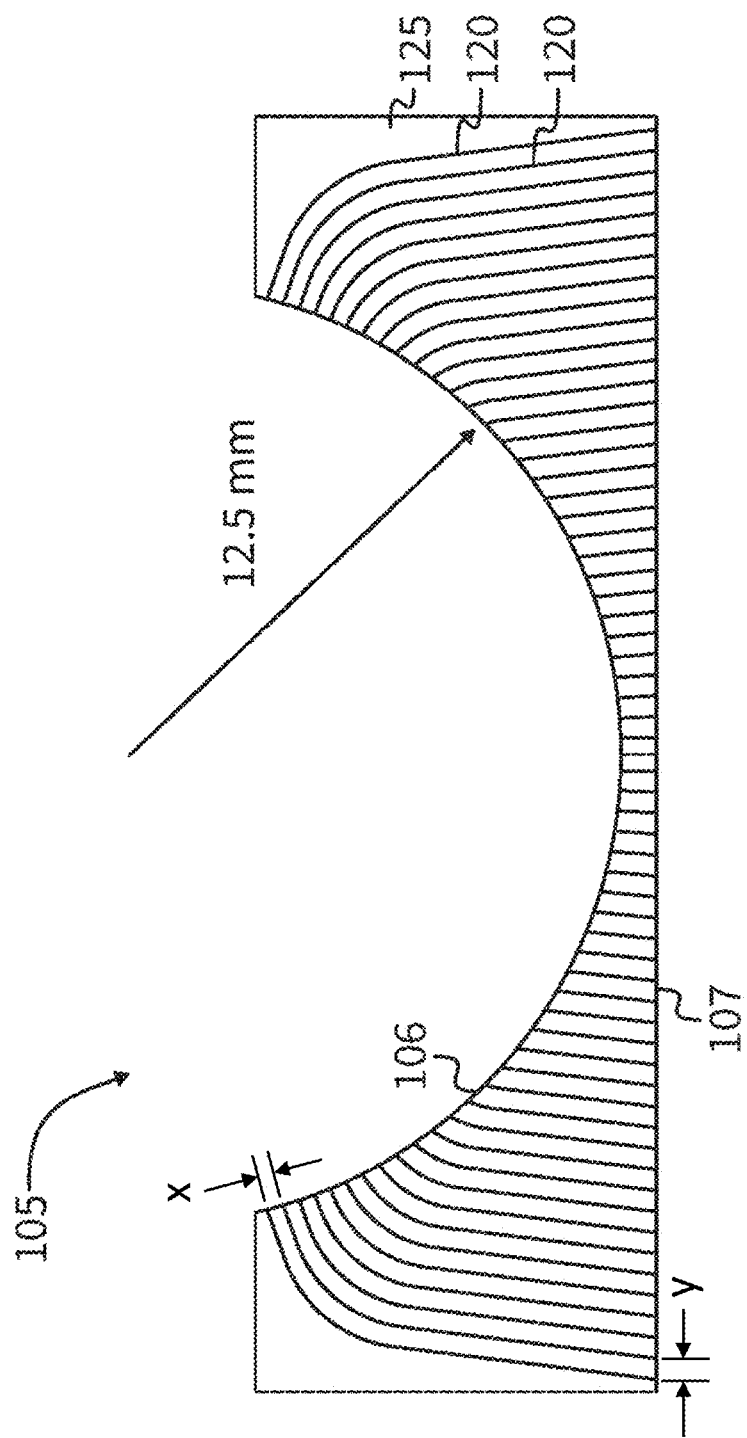
FIG. 1C is schematic side cross-sectional view of an interposer, according to an embodiment of the present disclosure.

The matrix 125 of the interposer 105 may be fabricated using three-dimensional (3D) printing of a preceramic polymer by stereolithography (SLA) or digital light processing (DLP) of preceramic resins, as shown in FIG. 1B. In the embodiment of FIG. 1B, a projector 135 (e.g., a DLP) selectively illuminates (e.g., with ultraviolet (UV) light) portions of the surface of a bath of a suitable preceramic resin 140 to cure the illuminated portions, thereby adding a layer to the top of the partially fabricated matrix. Once the portions are cured, the partially fabricated matrix is lowered by an amount approximately equal to the thickness of the layer, and the process is repeated. Holes 142, into which conductive material may be introduced during a subsequent step to form the interconnects 120, may be formed by not illuminating the corresponding regions in each layer. This process may produce a preceramic polymer matrix structure that may (as discussed in further detail below) be pyrolyzed to form a ceramic matrix structure. The embodiment of FIG. 1B may be capable of achieving a resolution of 1 micron (1 μm, or 1 um), enabling the fabrication of a printed interposer 105, which may then connect the curved detector 115 to a flat ROIC 110. A cross section of the interposer 105 is shown in FIG. 1C. As illustrated, the interconnects 120 may be curved, and, for example, each interconnect need not follow a straight path, e.g., perpendicular to the readout integrated circuit 110 (e.g., a straight line from a first end of an interconnect to a second end of the interconnect may be oblique to the surface of the readout integrated circuit 110). An interconnect may have a first radius of curvature at a point along the length of the interconnect, the first radius of curvature being less than 3 times the length of the interconnect, and the interconnect may have a minimum radius of curvature along the length of the interconnect greater than 0.1 times the length of the interconnect.

Figure 1D:
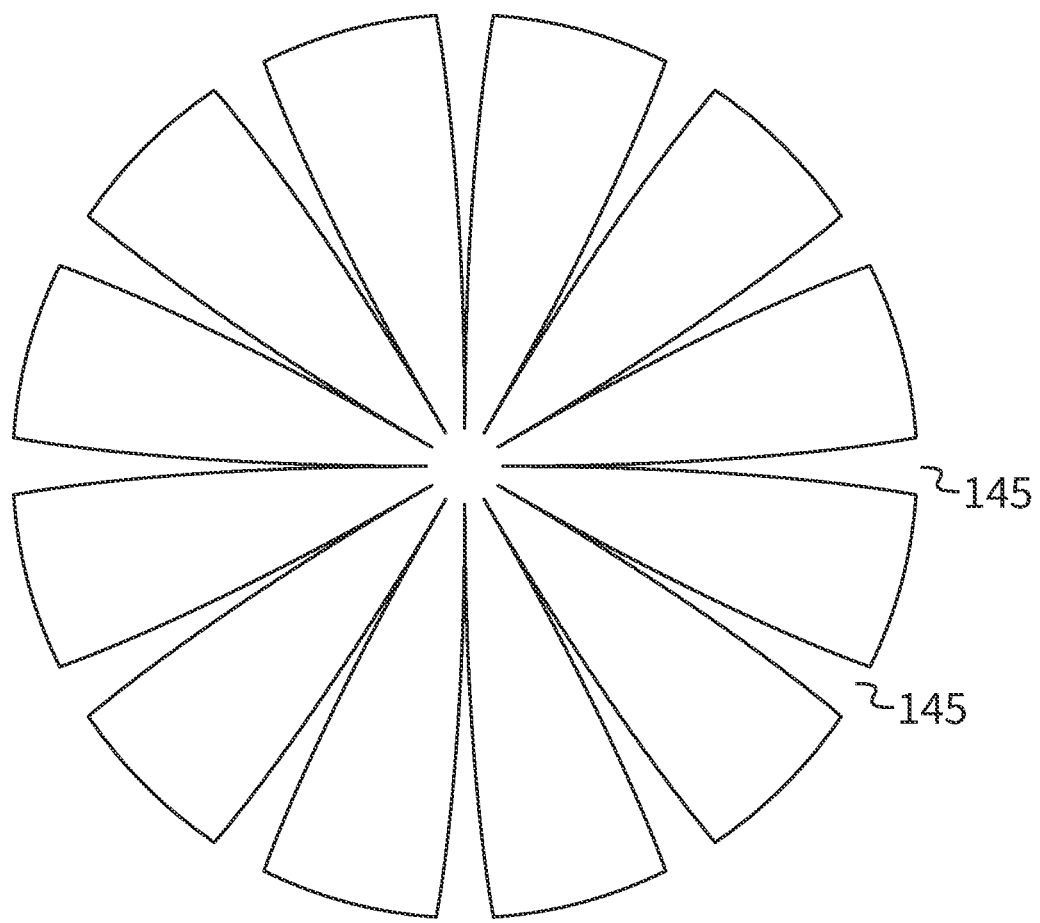
FIG. 1D is a plan view of a disk with strain relief cuts, according to an embodiment of the present disclosure.
Figure 1E:
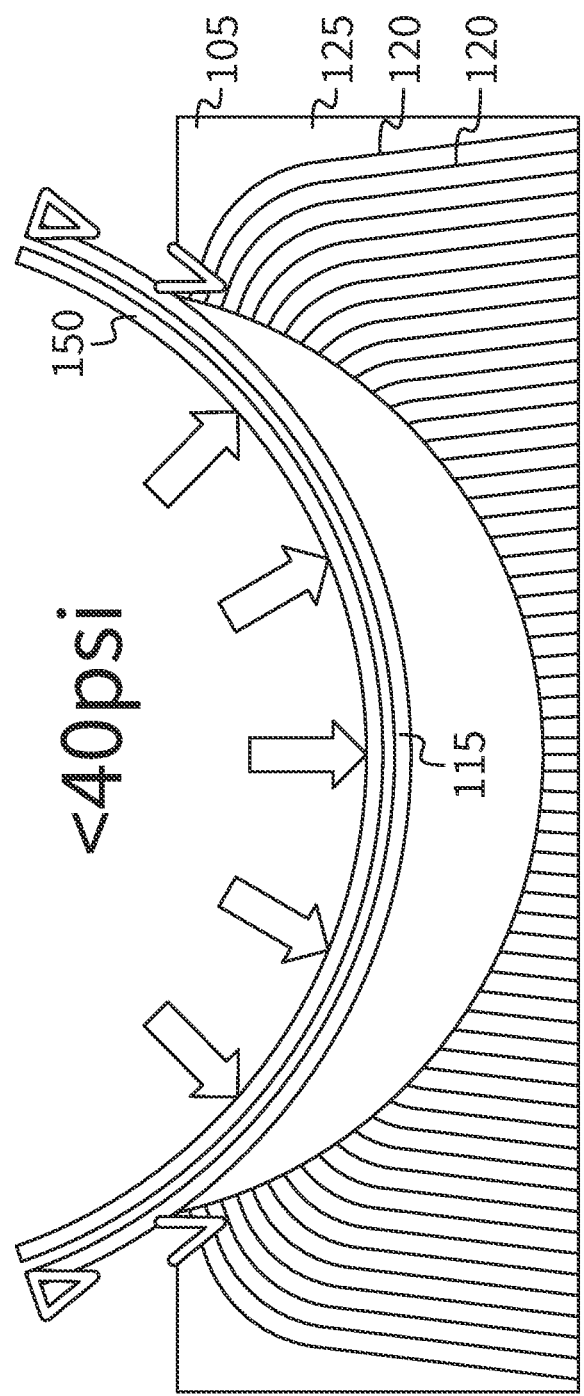
FIG. 1E is a schematic side cross-sectional view of a system for causing a detector to conform to a curved interposer surface, according to an embodiment of the present disclosure.

In some embodiments, the detector 115 is fabricated as a flat disk, with a thickness of between 1 micron and 100 microns (e.g., a thickness between 4 microns and 10 microns). The detector 115 may be, for example, a mid-wave infrared photodetector based on an InAsSb bulk alloy, or an InAs/InAsSb strained-layer superlattice, or a long-wave infrared photodetector based on other semiconductors. The detector may be slitted (FIG. 1D) and then curved into a shape approximating a portion of a sphere by causing it to conform to the curved surface 106 of the interposer 105, e.g., using low-pressure pneumatical shaping (using, e.g., an applied pressure of less than 100 pounds per square inch (psi), e.g., 40 psi or less), as illustrated in FIG. 1E. This pneumatic, free-edge semiconductor shaping method may involve pressurizing a membrane 150 to distribute the load evenly over the surface and suppresses wrinkling and buckling, and may make it possible to fabricate a curved spherical detector with a radius of curvature (ROC) of as little as 5 mm (e.g., a ROC of 12.5 mm). The slits (or "strain relief cuts" or "strain relief features") 145 may reduce principal strain to less than 0.5% and may also reduce biaxial tensile strain.

Figure 1F:
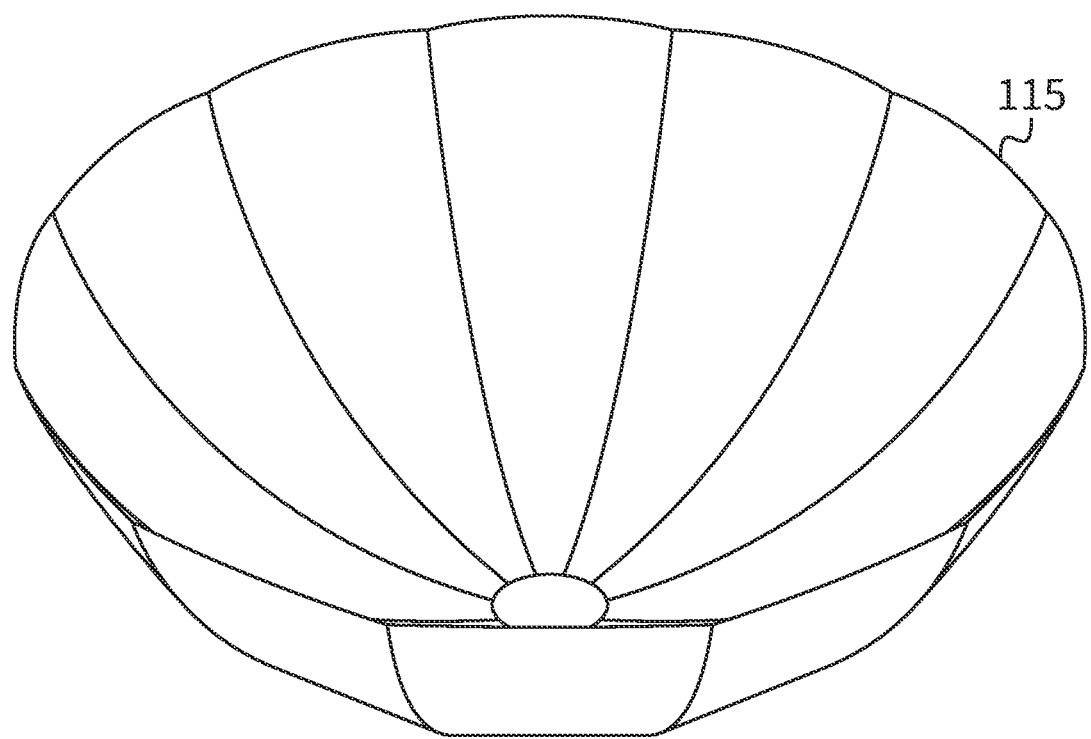
FIG. 1F is a perspective view of a spherical detector, according to an embodiment of the present disclosure.

FIG. 1F is an illustration of the substantially spherical shape that may result from this process. Commercial-of-the-shelf (COTS) ROICs may then be hybridized to the flat lower surface 107 of the interposer, e.g., by indium bump bonding. As mentioned above, the detector assembly may then be integrated with a lens 130 to create a wide field camera.

As mentioned above, the interposer 105 provides connections between a highly curved detector surface and a commercial-of-the-shelf (COTS) flat ROIC. This packaging technology may avoid the risk and repeated expense of designing a unique patterned ROIC for each detector format and radius of curvature. 3D printing technology enables arbitrary routing of interconnects inside the customized interposer so that at least 99% of the detector pixels on the curved front surface 106 of the interposer 105 are connected to the flat COTS ROIC on the flat lower surface 107 of the interposer 105 (the number of connections potentially being fewer than 100% in some devices because of imperfect yield).

Figure 2A:
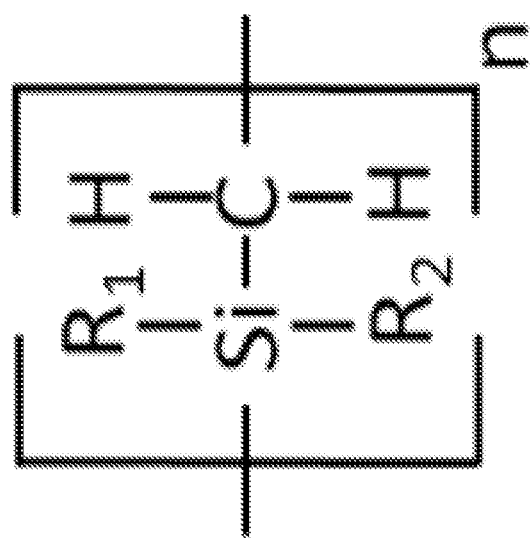
FIG. 2A is a structural formula of a monomer, according to an embodiment of the present disclosure.
Figure 2B:
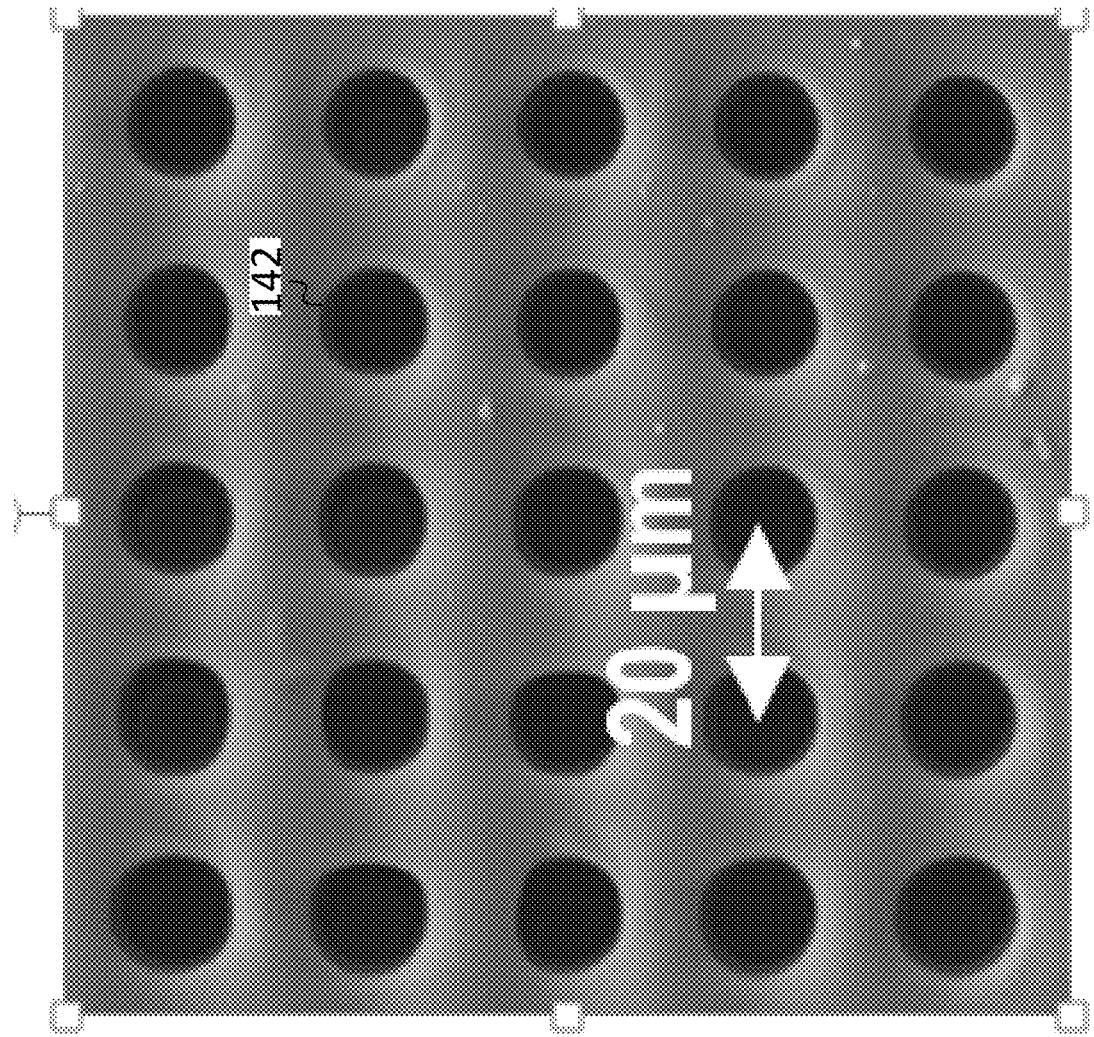
FIG. 2B is a micrograph of a portion of an as-printed ceramic interposer before metallization, according to an embodiment of the present disclosure.

As mentioned above, the matrix 125 of the interposer 105 may be fabricated by first forming a matrix structure composed of preceramic polymer, and then converting this preceramic polymer matrix structure to the ceramic matrix structure using pyrolysis. The pyrolysis heat treatment may be performed at a temperature above 700° C. The preceramic resin, which may be based on the monomer family of FIG. 2A, may lack micron-size particles (or larger particles) suspended in the resin (such particles, if present, might limit the resolution of the 3D printing method); the absence of such particles may enable printing fully dense ceramics at resolutions below 1 μm, and with an absence of pores (which might develop between the micron-size particles, if such particles were present). The resulting silicon oxycarbide (SiOC) ceramic is amorphous and may have a coefficient of thermal expansion (CTE) of 3 ppm/K, between that of Si (2.6 ppm/K) and that of the detector 115 (e.g., if the detector 115 is a III-V detector, and has a CTE between 4.5 ppm/K and 5.5 ppm/K). By adding $Al_2O_3$ (CTE=8 ppm/K) nanoparticles to the preceramic resin, the CTE of the resulting ceramic may be tailored to match the CTE of the III-V detector to decrease stresses during thermal cycling. In some embodiments, the proportion of nanoparticles in the resin is adjusted during the fabrication process (and may be increased or decreased with every layer being cured) to achieve a CTE gradient within the matrix 125 of the interposer 105, so that, e.g., the CTE of the interposer 105 is within 20% of 2.6 ppm/K at the flat lower surface 107 of the interposer, and the CTE of the interposer 105 is within 20% of 5.0 ppm/K at the curved surface 106 of the interposer 105. The nanoparticles may be between 30 nm and 100 nm and may be added at volume fractions of 5% to 50%, e.g., with a volume fraction of 10%-15%. Uniform and predictable shrinkage upon conversion from the polymer to ceramic state may be achieved, as may be seen in the uniformity of the spacing of the holes of FIG. 2B. Additionally, the interposer geometry bodes well for conversion of the preceramic polymer to ceramic, since the gases that evolve on pyrolysis can easily escape through the many holes 142.

Figure 3A:
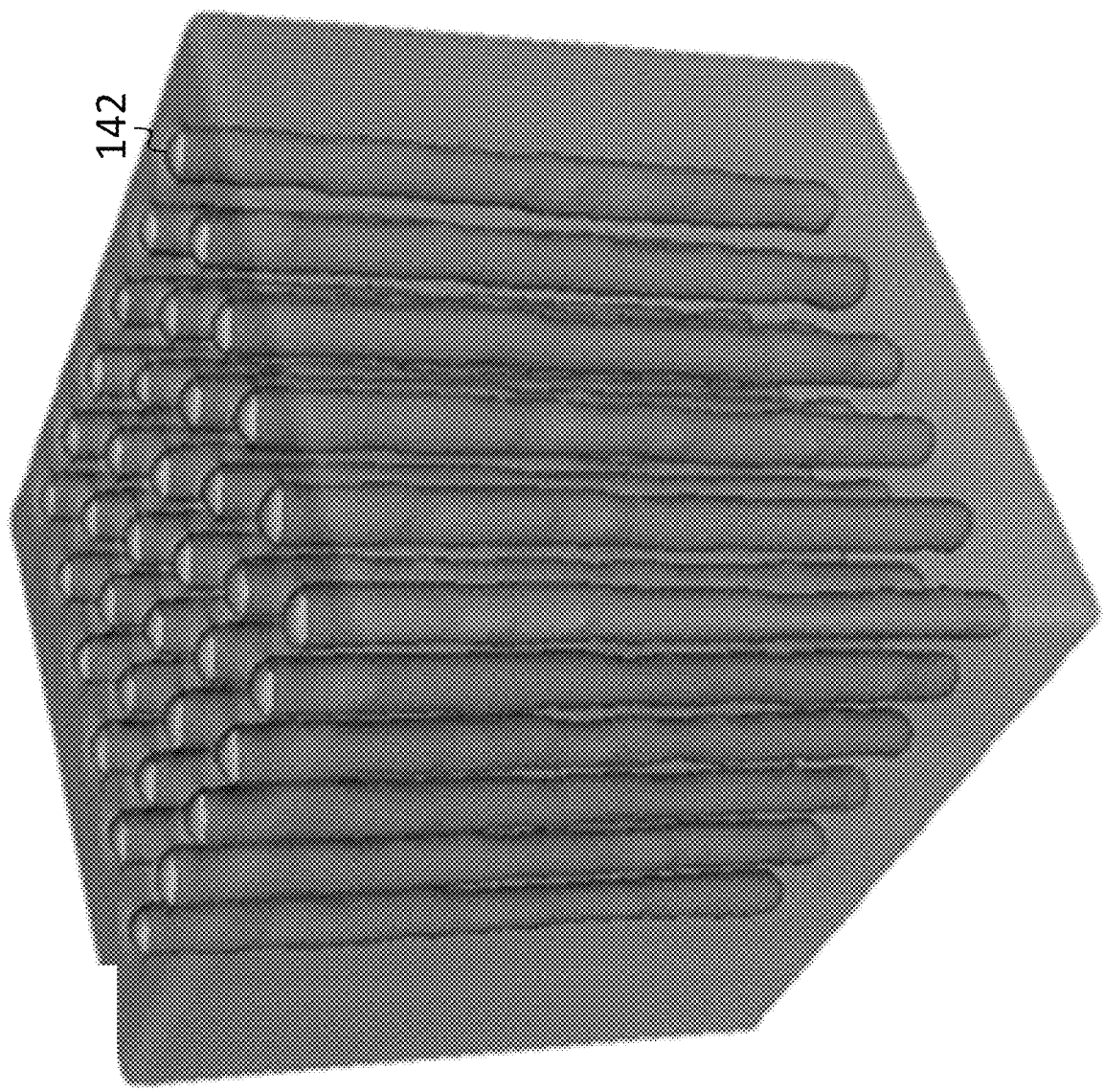
FIG. 3A is a perspective view of a portion of an interposer matrix, according to an embodiment of the present disclosure.
Figure 3B:
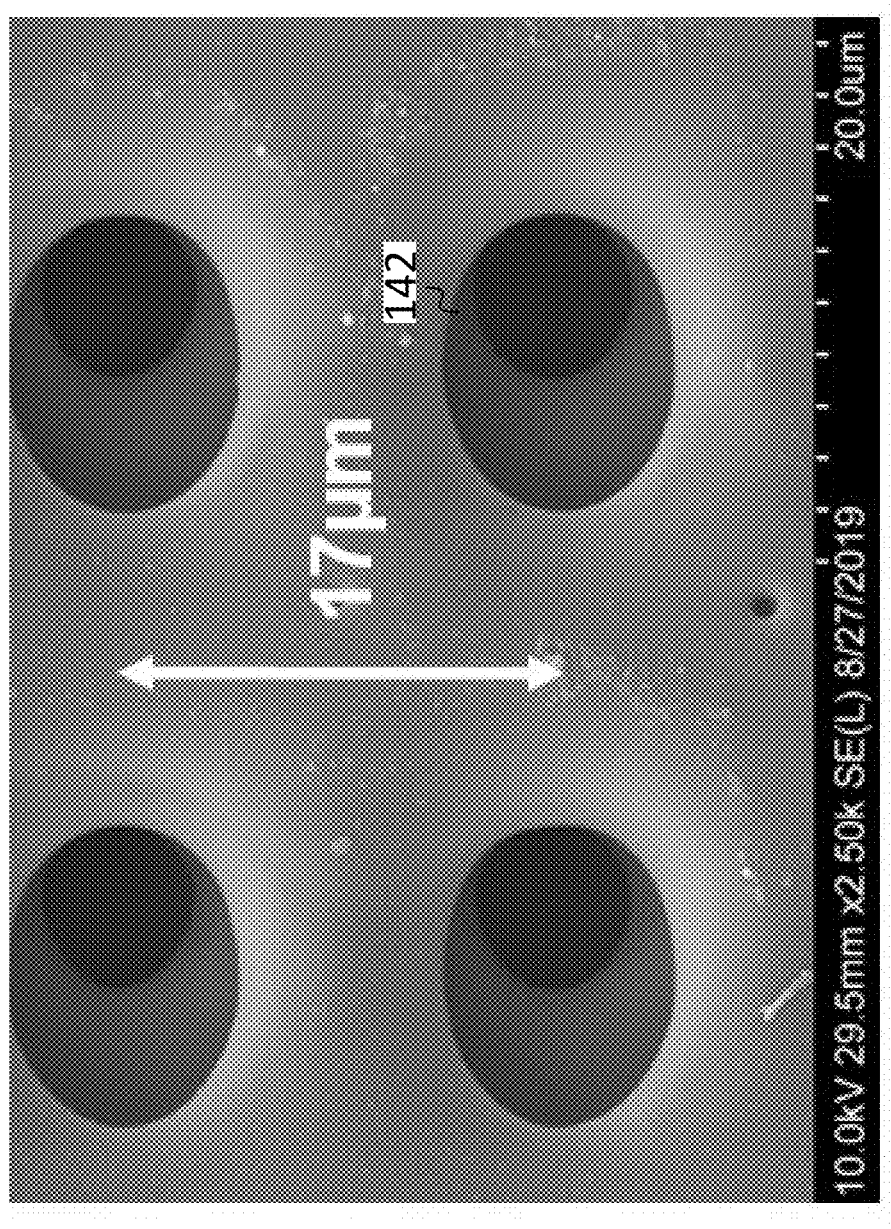
FIG. 3B is a micrograph of a portion of an interposer matrix, according to an embodiment of the present disclosure.
Figure 3C:
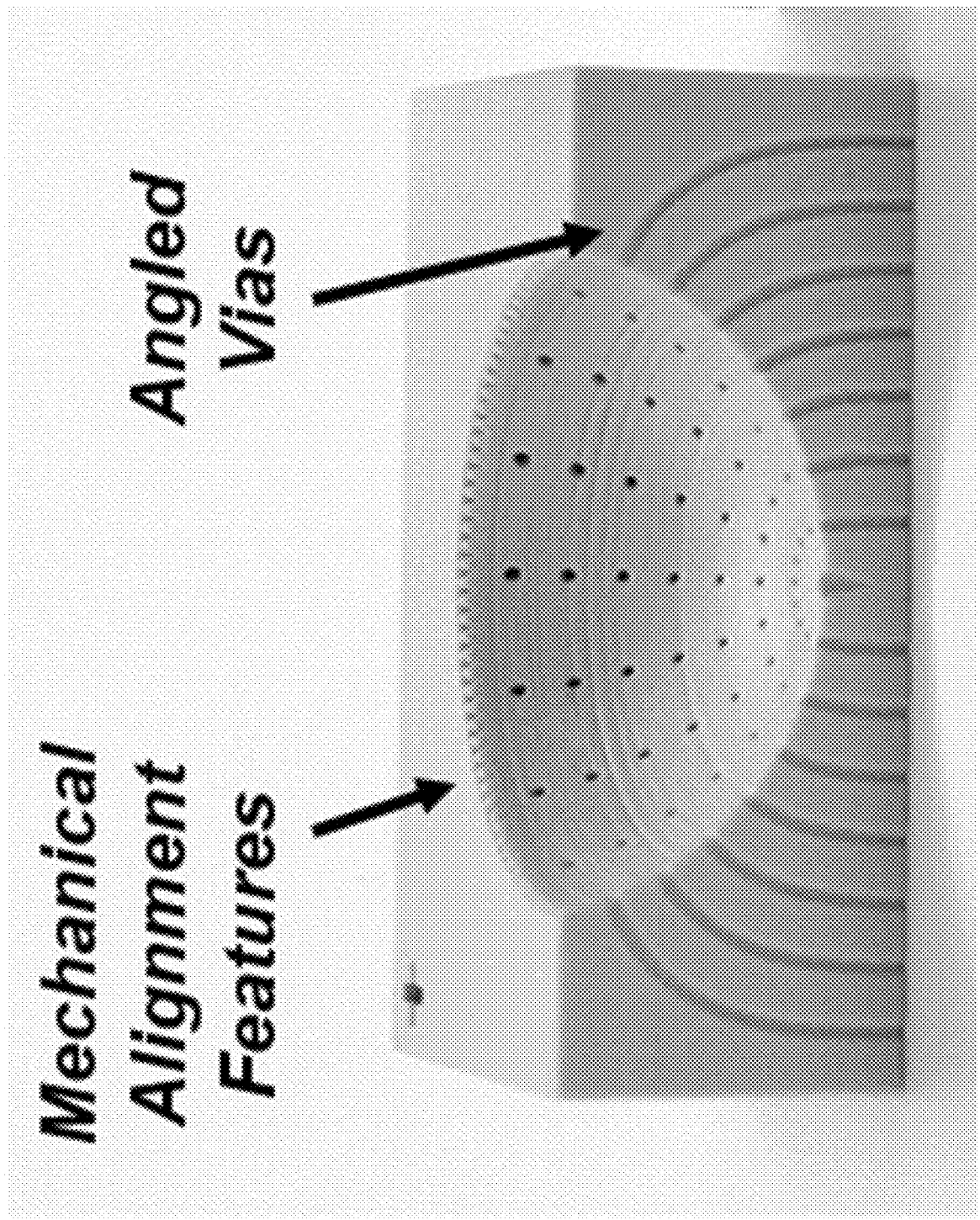
FIG. 3C is a photograph of a portion of an interposer matrix, according to an embodiment of the present disclosure.
Figure 3D:
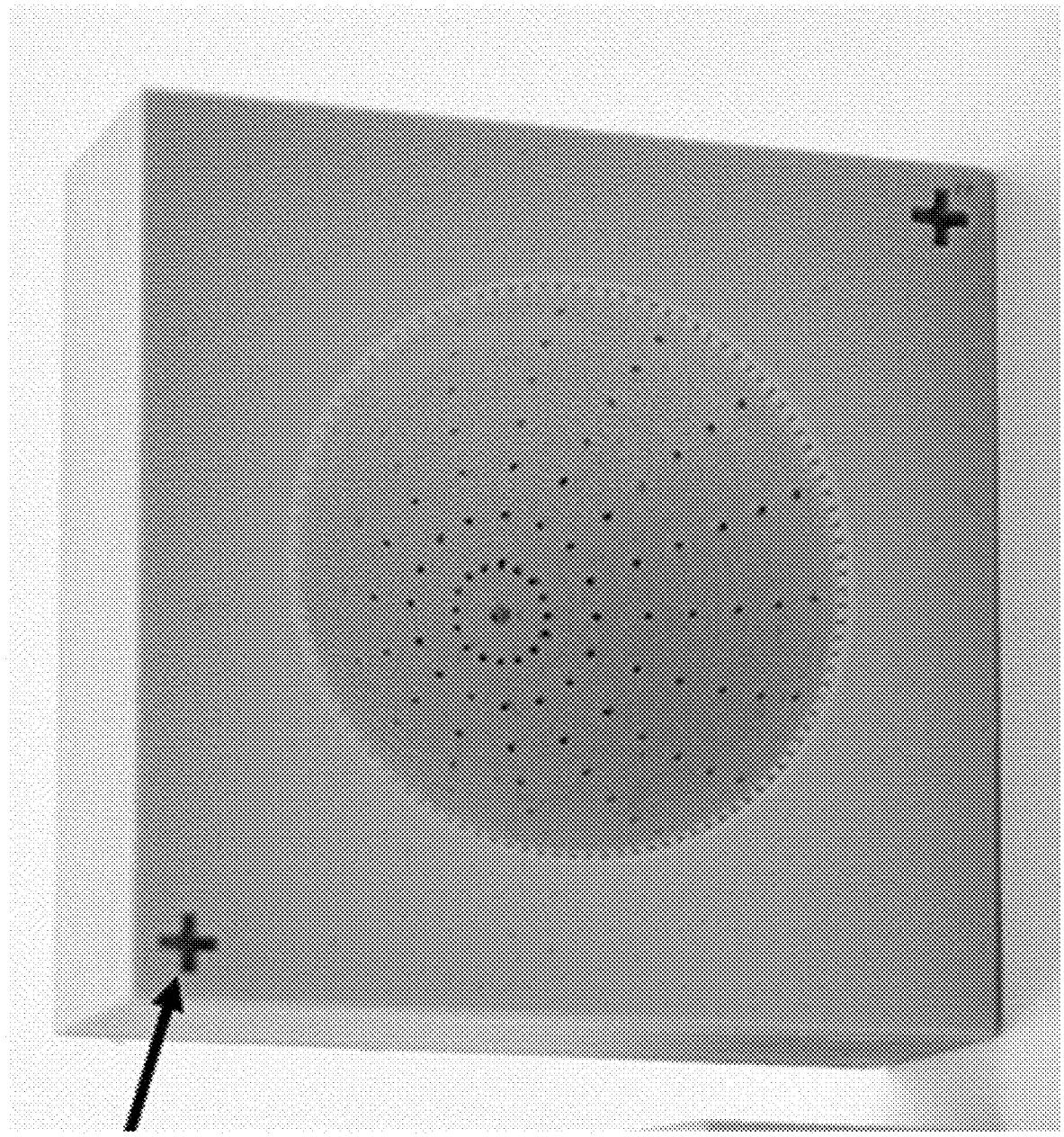
FIG. 3D is a photograph of an interposer matrix, according to an embodiment of the present disclosure.

Digital light processing (DLP) is a 3D printing method that may be capable of high speed and high resolution (and it may be faster than SLA) because an entire layer is cured at once by projecting an image instead of scanning a laser. The image may be projected by a 1920×1080 array of micro mirrors and may be demagnified arbitrarily with appropriate optics. In some embodiments, a printer that projects 1 μm pixels is capable of printing arrays of straight vias (as illustrated in FIG. 3A) and angled vias with diameter of less than 10 μm at a pitch of less than 20 μm in SiOC ceramic (as illustrated in FIG. 3B, FIG. 3C, and FIG. 3D). This can be scaled up to 3D print a larger (e.g. 40×30×13 mm) interposer by adding a mirror galvanometer to scan the projected image over a larger area, or by moving the projector or build platform to tile the part.

Figure 2C:
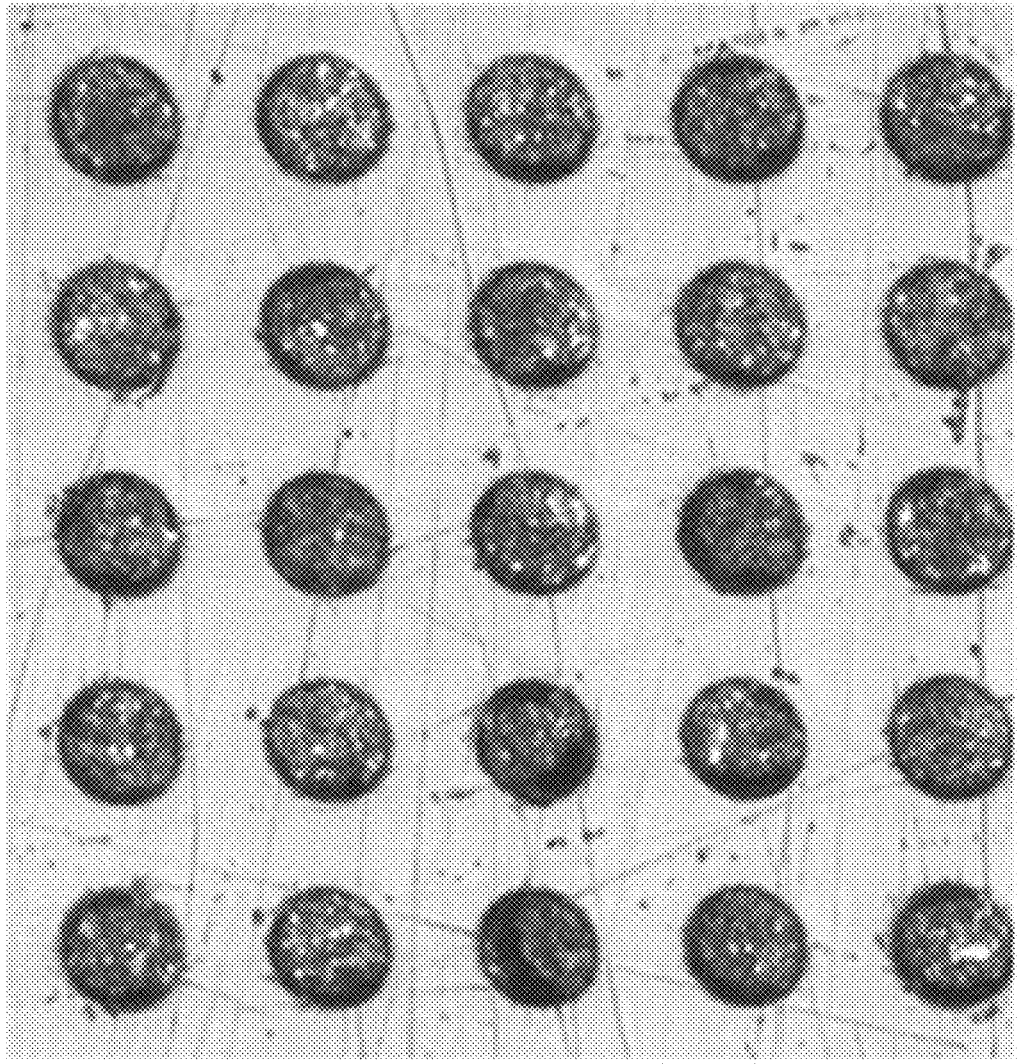
FIG. 2C is a micrograph of a portion of a ceramic interposer after metallization, according to an embodiment of the present disclosure.

Organic resins including acrylate based resin may also be used to print polymer interposers. Organic resins including acrylate based resin loaded with 30 vol %-60 vol % ceramic or glass particles may also be used to 3D print ceramic interposers by removing or debinding the resin thermally and sintering the ceramic or glass particles. Alternatively interposers composed of a polymer-ceramic matrix may be printed with organic resins containing 10 vol %-60 vol % ceramic or glass particles. After the fabrication of the ceramic interposer matrix structure (e.g., by 3D printing, resin removal, and sintering, or by 3D printing and pyrolyzing) the holes 142 may be metallized to form the interconnects 120 (or "vias"). In some embodiments, the metallizing may be performed before the final processing steps of the ceramic interposer matrix structure, e.g., before a pyrolyzing step. The interconnects 120 may be formed by metallizing the holes 142 using atomic layer deposition, electroplating or capillary-force and gravity driven melt infiltration with a solder that wets the ceramic (e.g., Sn with 1 wt %-2 wt % Ti, where the reactive Ti reduces the contact angle of the melt with SiO2, or Sn with 1 wt %-2 wt % Al or Mg). In some embodiments, platinum atomic layer deposition (ALD) followed by copper electroplating is used; this process may be capable of forming interconnects 120 with an aspect ratio of 100:1 or greater. FIG. 2C shows the result of this method, in one embodiment. In some embodiments ALD alone is used to metallize the holes, or electroplating alone is used (e.g., by placing the flat lower surface on a conductive plate that acts as the electrode, with the electroplating process causing the plating (which forms on the plate in the area of each hole 142) to grow axially within each hole 142).

In some embodiments, the interposer 105 includes interconnects 120 with aspect ratios beyond 1000, which may be challenging to metallize using certain plating techniques (e.g., electroplating). Melt infiltration may be used to metallize the holes 142 in such embodiments since the ceramic interposer matrix can withstand high temperatures. Melt infiltration is a rapid process that is not limited by aspect ratio when assisted by gravity, provided that a contact angle of less than 90 degrees exists between the liquid metal and the native silicon oxide on the interposer. After conversion to ceramic and metallization, the curved surface may be optically polished, or machined or turned on a lathe to achieve the precise design curvature and to eliminate steps from the 3D printing process. Similarly, the bottom surface may be polished to achieve a high degree of flatness and low surface roughness for attaching ROIC(s).

Figures 4A, 4B:
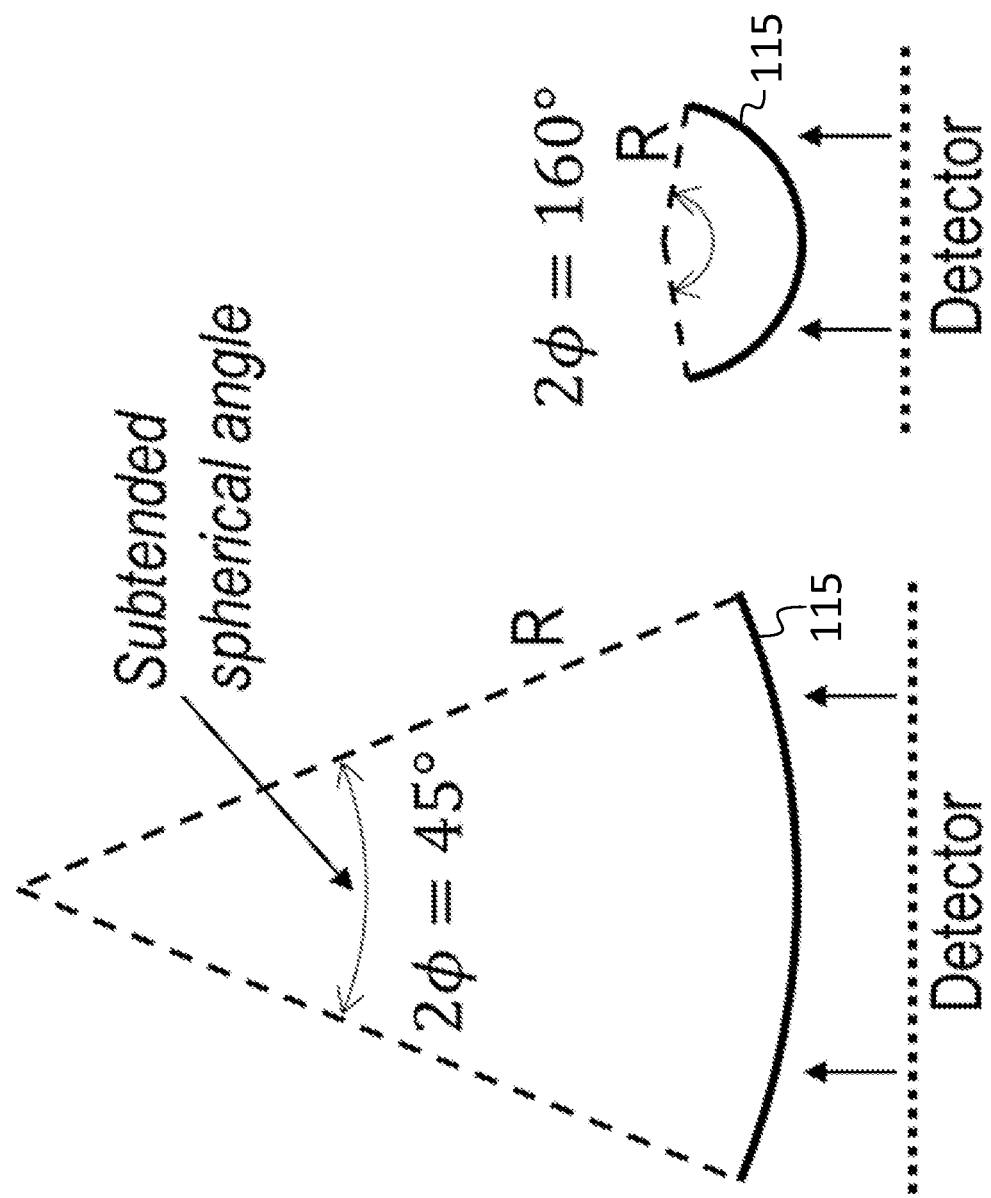
FIG. 4A is an illustration of detector geometry, according to an embodiment of the present disclosure.
FIG. 4B is an illustration of detector geometry, according to an embodiment of the present disclosure.

Cameras with curved detectors may be built with this technology for visible light, infrared, or other wavelengths. The curvature of the detector 115 may be described by the subtended spherical angle as shown in FIGS. 4A and 4B. This angle may be between 1 and 180 degrees (e.g., it may be at least 10 degrees); for a detector that is a full hemisphere this angle is 180 degrees. The detector arc length is defined by the radius R in FIGS. 4A and 4B (e.g., the arc length is given by $2\phi R$, where $2\phi$ is the subtended spherical angle in radians). For example, the detector arc length may be 55 mm and R=70 mm and $2\phi=45°$ (FIG. 4A), or the detector arc length may be 35 mm and R=12.5 mm and $2\phi=160°$ (FIG. 4B). These are only examples and depending on the target application the detector arc length may be between 10 mm and 100 mm. As used herein, the "maximum chord length" of the detector 115 is the greatest center-to-center distance between any pair of pixels of the detector 115. In some embodiments, the maximum chord length of the detector 115 is between 5 mm and 50 mm.

The interposer 105 may include one interconnect for each pixel on the detector and ROIC. For example, the IR detector may have at least 500,000 pixels, and the format of the IR detector may be 1 k×1 k (i.e., 1024×1024, with slightly more than 1 million pixels), 4 k×4 k, or even 8 k×8 k (with more than 64 million pixels). The pitch of the interconnects 120 of the interposer 105 may match the pitch of the detector 115 at the curved surface 106 of the interposer 105, and the pitch of the interconnects 120 may match the pitch of the readout integrated circuit 110 at the flat lower surface 107 of the interposer. At each of these two surfaces the pitch may be between 8 um and 50 um, e.g., between 10 um and 20 um. The interconnect diameter may then be a fraction of the pitch, e.g., between 10% and 70% of the pitch.

The interposer 105 facilitates the use of one or multiple ROICs with a single detector. The interconnects are routed through the interposer 105 to map the detector pixel array to the appropriate ROIC terminal. As ROICs may have a sensing border around the edges for the electronics and connects, decoupling the ROIC from the detector allows for near seamless coverage of the detector surface at pixel counts greater than those available in a single ROIC. Furthermore, decoupling the ROIC from the detector makes it possible for strain relief features, such as seams (each seam including, e.g., a strain relief cut or "slit"), to be present in the detector, without having to undergo the restrictive and costly endeavor of changing the layout of the ROIC or adding read-outs along each seam which would reduce the area available for sensing.

The invention is not limited to configurations with a single readout integrated circuit 110 on a flat surface of the interposer 105. FIG. 5, for example, shows an embodiment with five ROICs on the interposer 105, which in FIG. 5 has the shape of an inverted truncated four-sided pyramid, with a readout integrated circuit 110 on the flat lower surface 107 of the interposer and on each of the four sloping sides. Such an embodiment has the benefit of achieving a shorter physical (and electrical) length of the longest (worst case) interconnect 120. In some embodiments, the interposer 105 is fabricated in sections 510 which are then bonded (or otherwise secured) together, as shown in FIG. 5.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an interposer for a curved detector have been specifically described and illustrated herein, many modifications and variations will be apparent to those skilled in the art. Accordingly, it is to be understood that an interposer for a curved detector constructed according to principles of this disclosure may be embodied other than as specifically described herein. The invention is also defined in the following claims, and equivalents thereof.

What is claimed is:

1. A system, comprising:
   a curved array photodetector;
   a first readout integrated circuit, the first readout integrated circuit being substantially flat; and
   an interposer, between the photodetector and the first readout integrated circuit,
   the photodetector having a plurality of electrical contacts,
   the first readout integrated circuit having a plurality of electrical contacts, and
   the interposer comprising a first conductor connecting a first contact, of the plurality of electrical contacts of the photodetector, and a second contact, of the plurality of electrical contacts of the first readout integrated circuit,
   wherein:
   the interposer has a first surface, and a second surface,
   the first surface is substantially spherical;
   the photodetector is substantially spherical, and conforms to the first surface; and
   the second surface is substantially flat.

2. The system of claim 1, further comprising a second conductor, the second conductor connecting a third contact, of the plurality of electrical contacts of the photodetector, and a fourth contact, of the plurality of electrical contacts of the first readout integrated circuit, the third contact being adjacent to the first contact, and the fourth contact being adjacent to the second contact,
   wherein a separation between the second contact and the fourth contact is different, by at least 10%, from a separation between the first contact and the third contact.

3. The system of claim 2, wherein the separation between the first contact and the third contact is at least 1 micron and at most 100 microns.

4. The system of claim 1, wherein:
   the first surface of the interposer has a first radius of curvature, and
   the photodetector is substantially spherical, conforms to the first surface, and subtends an angle of at least 10 degrees.

5. The system of claim 1, wherein the photodetector has a plurality of strain relief cuts.

6. The system of claim 1, wherein a maximum chord length of the photodetector is greater than 5 mm and less than 50 mm.

7. The system of claim 1, wherein the photodetector comprises at least 500,000 pixels.

8. The system of claim 1, wherein the photodetector comprises an infrared photodetector based on a III-V semiconductor structure.

9. The system of claim 1, further comprising a second readout integrated circuit having a plurality of electrical contacts, wherein the interposer further comprises a second conductor connecting a third contact, of the plurality of electrical contacts of the photodetector, and a fourth contact, of the plurality of electrical contacts of the second readout integrated circuit.

* * * * *